United States Patent [19]

Hoshi

[11] Patent Number: 4,943,738
[45] Date of Patent: Jul. 24, 1990

[54] DIGITAL SIGNAL INPUT BUFFER CIRCUIT HAVING A SIMPLE CONSTRUCTION AND CAPABLE OF RETAINING DATA

[75] Inventor: Katsuji Hoshi, Tokyo, Japan
[73] Assignee: NEC Corporation, Tokyo, Japan
[21] Appl. No.: 291,886
[22] Filed: Dec. 29, 1988
[30] Foreign Application Priority Data Dec. 29, 1987 [JP] Japan .................. 62-332299

[51] Int. Cl.$^5$ ............ H03K 03/356; H03K 5/24
[52] U.S. Cl. ......................... 307/362; 307/279; 307/530
[58] Field of Search ............ 307/530, 362, 279

[56] References Cited

U.S. PATENT DOCUMENTS 4,096,402 6/1978 Schroeder et al. ............ 307/362
4,441,039 4/1984 Schuster ..................... 307/530
4,649,293 3/1987 Ducourant ................... 307/362

Primary Examiner—John Zazworsky
Attorney, Agent, or Firm—Sughrue, Mion, Zinn, Macpeak & Seas

[57] ABSTRACT

An input buffer circuit includes a flipflop circuit and receives an input voltage signal and a reference voltage to amplify a difference between the input voltage signal and the reference voltage in response to an activation signal. The input buffer circuit comprises first and second transistors having their sources commonly connected to a first node and their drains coupled to a pair of inputs of the flipflop circuit, respectively. A gate of the first transistor is connected to receive the input voltage signal and a gate of the second transistor is connected to receive the reference voltage. A capacitor is connected at its one end to the first node and at its other end to a second node. There is provided a bias control circuit having an output connected to the second node and operating to respond to a precharge signal so as to bring the second node to a first level and to respond to the activation signal so as to bring the second node to a second level lower than the first level, so that the potential of the first node is consequentially lowered when the input buffer circuit executes the comparison operation in response to the activation signal and a current flowing through the first and second transistors is blocked by the capacitor.

5 Claims, 4 Drawing Sheets

DIGITAL SIGNAL INPUT BUFFER CIRCUIT HAVING A SIMPLE CONSTRUCTION AND CAPABLE OF RETAINING DATA

BACKGROUND OF THE INVENTION

1. Field of the Invention

The present invention relates to an input buffer for digital signal circuits, and more specifically to an input buffer for comparing an input voltage signal with a reference voltage and amplifying the voltage difference between the output voltage signal and the reference voltage.

2. Description of Related Art

At present, various types of input buffers have been proposed and used in the field of integrated circuit memories. For a stable and regular operation, the input buffers should have (1) a function of holding an input voltage and hence an output signal; (2) a narrow insensible band or zone in an input level discrimination; and (3) a simple circuit construction.

However, some conventional input buffers cannot retain an output data, and therefore, if the input buffer is used, a circuit connected to receive an output of the input buffer has been required for input information. As a result, the overall construction of the circuit including the input buffers had to have an increased number of circuit elements. Furthermore, the conventional input buffers have been required to provide a one-shot circuit for elevating the level of an input signal and also capable of receiving a latch signal for introducing an input signal to the input buffer.

SUMMARY OF THE INVENTION

Accordingly, it is an object of the present invention to provide an input buffer which has overcome the above mentioned defects of the conventional input buffer.

Another object of the present invention is to provide an input buffer having a data retaining function so that a circuit receiving an output of the input buffer is not required to have a data holding function.

Still another object of the present invention is to provide an input buffer capable of treating a wide voltage range to input signal without requiring a one-shot circuit for elevating a level of an input signal.

A further object of the present invention is to provide an input buffer of simple construction and low power consumption.

The above and other objects of the present invention are achieved in accordance with the present invention by an input buffer circuit which includes a flipflop circuit and which receives an input voltage signal and a reference voltage to amplify a difference between the input voltage signal and the reference voltage in response to an activation signal, comprising first and second transistors having their sources commonly connected to a first node and their drains coupled to a pair of inputs of the flipflop circuit, respectively, a gate of the first transistor being connected to receive the input voltage signal and a gate of the second transistor being connected to receive the reference voltage; a capacitor connected at its one end of the first node and at its other end to a second node; and a bias control circuit having an output connected to the second node and operating to respond to a percharge signal so as to bring the second node to a first level and to respond to the activation signal so as to bring the second node to a second level lower than the first level, so that the potential of the first node is consequentially lowered when the input buffer circuit executes the comparison operation in response to the activation signal and a current flowing through the first and second transistors is blocked by the capacitor.

In a preferred embodiment, the bias control circuit includes a third transistor having a drain connected to a high level voltage and a source connected to the second node, a gate of the third transistor being connected to receive the precharge signal, and a source-grounded fourth transistor having a drain connected to the second node, a gate of the fourth transistor being connected to receive the activation signal.

More specifically, the flipflop circuit fifth and sixth transistors having their drains commonly connected to receive the activation signal and their sources connected to third and fourth nodes, respectively, respective gates of the fifth and sixth transistors being connected to fifth and sixth nodes, respectively, a source-grounded seventh transistor having a drain connected to the third node and a gate connected to the fourth node, a source-grounded eighth transistor having a drain connected to the fourth node and a gate connected to the third node, ninth and tenth transistors having their drains connected to a high level voltage and their gates connected to receive the percharge signal, respective sources of the ninth and tenth transistors being connected to the fifth and sixth nodes, respectively, and source-grounded eleventh and twelfth transistors having their drains connected to the fifth and sixth nodes, respectively and their gates connected to the gates of the seventh and eighth transistors, respectively.

The above and other objects, features and advantages of the present invention will be apparent from the following description of preferred embodiments of the invention with reference to the accompanying drawings.

DESCRIPTION OF THE PREFERRED EMBODIMENTS

Figure 1:
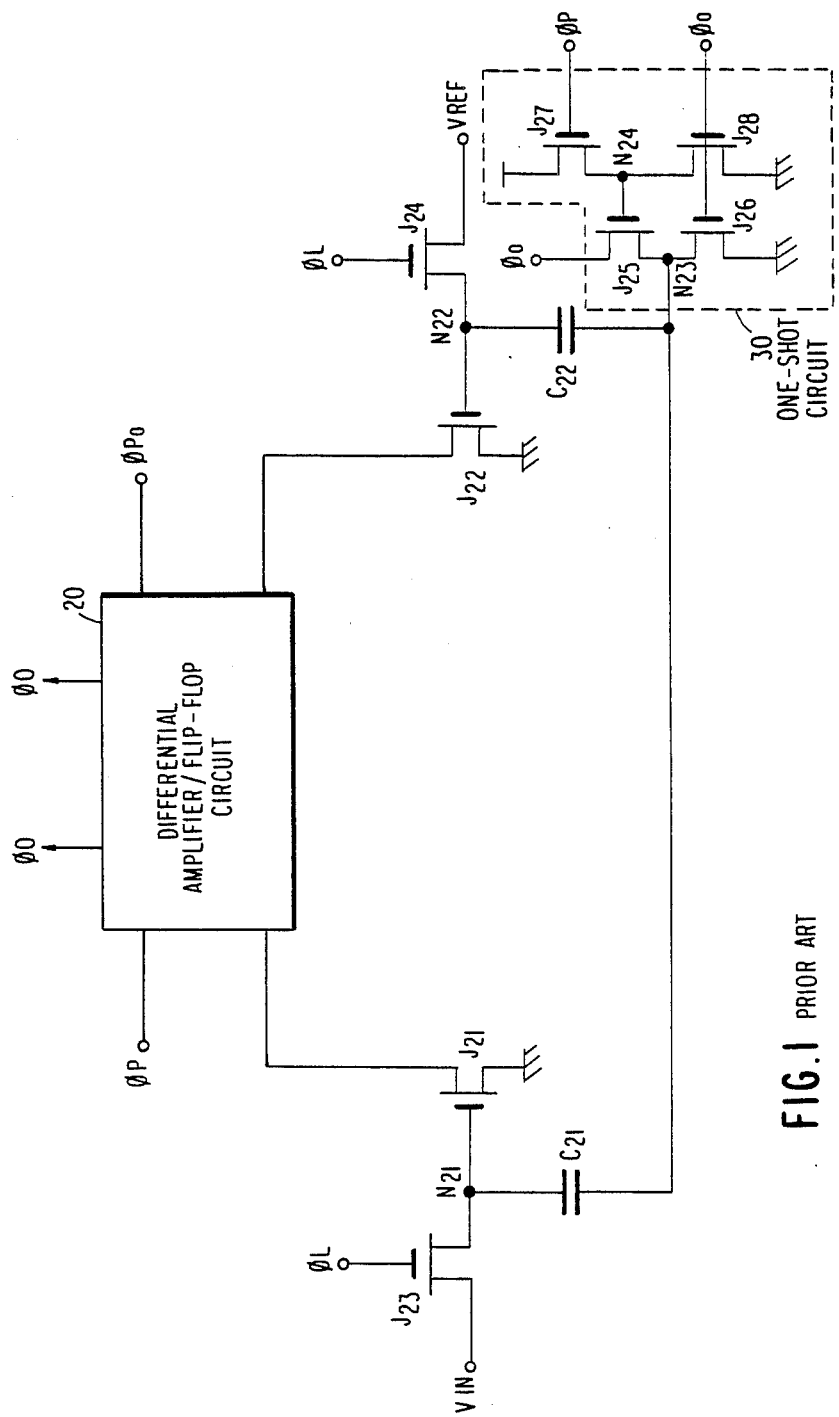
FIG. 1 is a circuit diagram of a conventional input buffer.

Referring to FIG. 1, there is shown in a circuit diagram of a typical input buffer in the prior art. The shown circuit is constructed to receive an external input voltage $V_{IN}$ and a reference voltage $V_{ref}$ as well as a latch signal $\phi_L$, a precharge signal $\phi_p$ and an activation signal $\phi_a$ and to generate true and complementary output signals $\phi_o$ and $\overline{\phi_o}$. The shown circuit is composed of only N-channel enhancement MOS field effect transistors.

The external input voltage $V_{IN}$ is inputted to a drain of a MOS transistor $J_{23}$ having a gate connected to receive the latch signal $\phi_L$, and the reference voltage $V_{ref}$ is inputted to a drain of a MOS transistor $J_{24}$ having a gate connected to also receive the latch signal $\phi_L$. A source of the MOS transistor $J_{23}$ is connected to a node $N_{21}$, and on the other hand, a source of the MOS transistor $J_{24}$ is connected to a node $N_{22}$. Therefore, if the latch signal $\phi_L$ of a high level is applied to the gates of the transistors $J_{23}$ and $J_{24}$, the external input voltage $V_{IN}$ and the reference voltage $V_{ref}$ are transferred to and held on the node $N_{21}$ and $N_{22}$, respectively.

The node $N_{21}$ is connected to a gate of MOS transistor $J_{21}$ having a source grounded and a drain coupled to one input of a differential amplifier/flipflop circuit 20. on the other hand, the node $N_{22}$ is connected to a gate of MOS transistor $J_{22}$ having a source grounded and a drain coupled to the other input of the differential amplifier/flipflop circuit 20. The differential amplifier/flipflop circuit 20 operates to compare two input voltages and to emphasize or amplify a difference between the two input voltages.

The node $N_{21}$ is also connected to one electrode of a capacitor $C_{21}$ and the node $N_{22}$ is also connected to one electrode of capacitor $C_{22}$. The other electrodes of these capacitors $C_{21}$ and $C_{22}$ are connected to an output of a one-shot circuit 30. The one-shot circuit 30 includes a pair of transistors $J_{27}$ and $J_{28}$ connected in series between a positive power supply terminal and ground and connected to receive at their gates the precharge signal $\phi_p$ and the activation signal $\phi_a$, respectively. A connection node $N_{24}$ between the transistors $J_{27}$ and $J_{28}$ is connected to a gate of a transistor $J_{25}$ having a drain connected to receive the activation signal $\phi_a$. A source of the transistor $J_{25}$ is connected to a node $N_{23}$ which is connected to receive the activation signal $\phi_a$. The node $N_{23}$ is connected to the other electrode of the capacitors $C_{21}$ and $C_{22}$.

Figure 2:
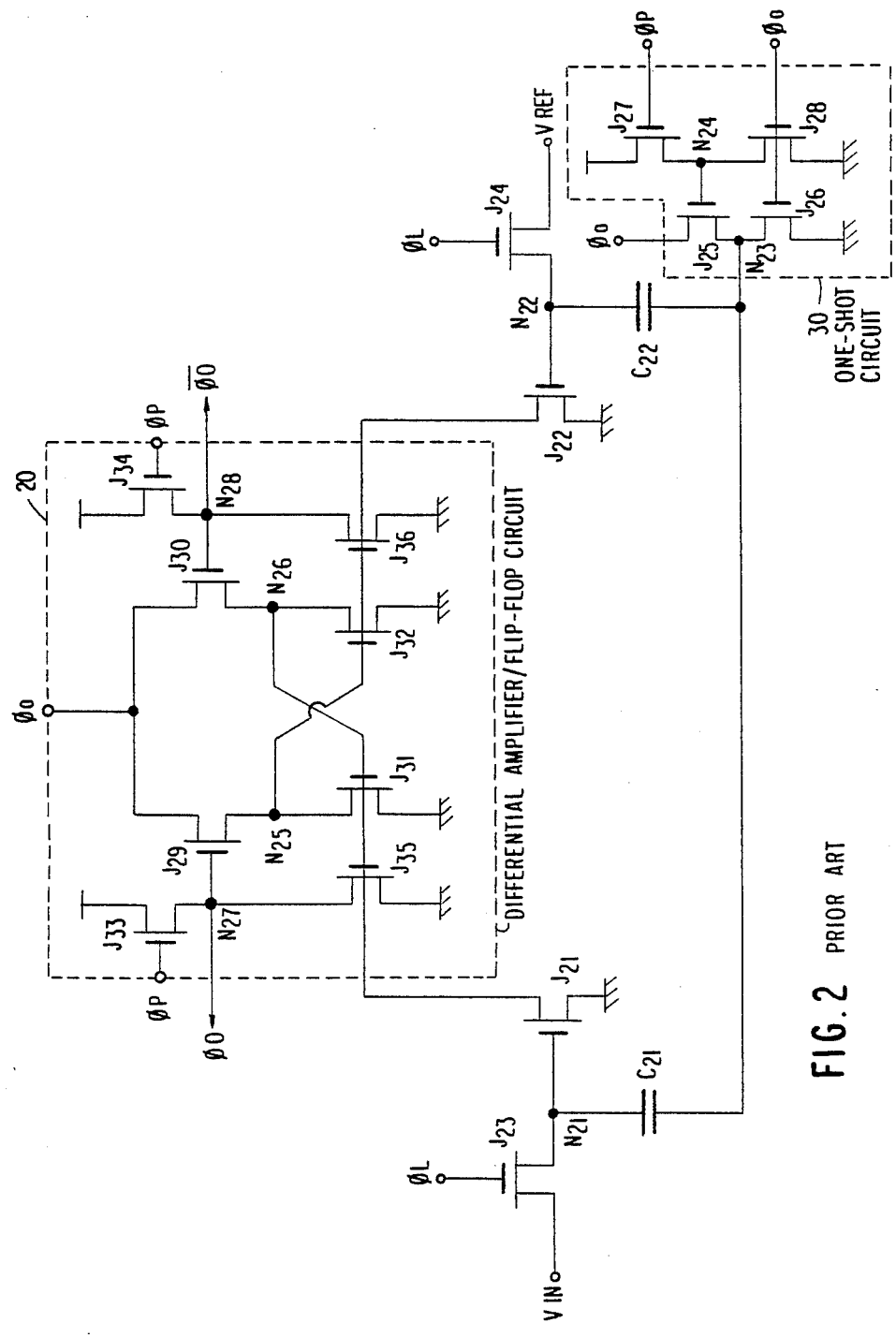
FIG. 2 is a more detailed circuit diagram of the conventional input buffer shown in FIG. 1.

As shown in detail in FIG. 2, the differential amplifier/flipflop circuit 20 can assume one of constructions which are widely used in current MOS dynamic random memory integrated circuits with a 5V single voltage supply. The circuit 20 includes a pair of transistors $J_{29}$ and $J_{30}$ having their drains commonly connected to receive the activation signal $\phi_a$. A source of the transistor $J_{29}$ is connected to a node $N_{25}$, which is in turn connected to a drain of a source-grounded transistor $J_{31}$, and on the other hand, a source of the transistor $J_{30}$ is connected to a node $N_{26}$, which is in turn connected to a drain of another source-grounded transistor $J_{32}$. A gate of the transistor $J_{31}$ is cross-connected to the node $N_{26}$, which is also connected to the drain of the transistor $J_{21}$, and on the other hand, a gate of the transistor $J_{32}$ is cross-connected to the node $N_{25}$, which is also connected to the drain of the transistor $J_{22}$.

Furthermore, the differential amplifier/flipflop circuit 20 includes a transistor $J_{33}$ having its drain to the positive power supply and its gate connected to receive the precharge signal $\phi_p$. A source of the transistor $J_{33}$ is connected through a node $N_{27}$ to a gate of the transistor $J_{29}$ and a drain of a source-grounded transistor $J_{35}$ whose gate is connected to the gate of the transistor $J_{31}$. The connection node $N_{27}$ between the transistors $J_{33}$ and $J_{35}$ gives the true output signal $\phi_o$. On the other hand, there is provided a transistor $J_{34}$ having its drain connected to the positive power supply and its gate connected to receive the precharge signal $\phi_p$. A source of the transistor $J_{34}$ is connected through a node $N_{28}$ to a gate of the transistor $J_{30}$ and a drain of another source-grounded transistor $J_{36}$ whose gate is connected to the gate of the transistor $J_{32}$. The connection node $N_{28}$ between the transistors $J_{33}$ and $J_{35}$ gives the complementary output signal $\bar{\phi}_o$.

Incidentally, the reference voltage $V_{ref}$ is given from a reference voltage generator (not shown) which is installed on the substrate on which the above mentioned input buffer is installed. However, the reference voltage generator itself is well known to persons skilled in the art, and therefore, explanation thereof will be omitted for simplification of the description.

Now, explanation will be made on operation of the input buffer mentioned above. First, the precharge signal $\phi_p$ having a voltage sufficiently higher than a threshold voltage $V_T$ of the transistors is applied to the gate of the transistors $J_{33}$ and $J_{34}$. Here, a voltage sufficiently higher than the threshold voltage $V_T$ of the transistors will be called a "high level". As a result, the transistors $J_{27}$, $J_{33}$ and $J_{34}$ are activated or turned on, so that the nodes $N_{24}$, $N_{27}$ and $N_{28}$ are brought to a high level. At this time, the activation signal $\phi_a$ is maintained at a voltage sufficiently lower than the threshold voltage $V_T$ of the transistors (a voltage sufficiently lower than the threshold voltage $V_T$ of the transistors will be called a "low level" hereinafter), and therefore, the nodes $N_{23}$, $N_{25}$ and $N_{26}$ are maintained at a low level. Thereafter, the precharge signal $\phi_p$ is brought to a low level.

Then, the latch signal $\phi_L$ is brought from a low level to a high level. Therefore, the external input voltage $V_{IN}$ and the reference voltage $V_{ref}$ are latched on the nodes $N_{21}$ and $N_{22}$, respectively. Thereafter, when the activation signal $\phi_a$ is brought from the low level to a high level, the nodes $N_{25}$ and $N_{26}$ elevate their potentials through the transistors $J_{29}$ and $J_{30}$ since the nodes $N_{27}$ and $N_{28}$ have been maintained at the high level. At the same time, the node $N_{23}$ elevates its potential through the transistor $J_{25}$ since the node $N_{24}$ has been maintained at the high level. However, with elapse of time, the potential of the node $N_{23}$ is decreased and finally brought to a low level by the action of the transistors $J_{26}$ and $J_{28}$ which have been turned on by the high level activation signal $\phi_a$. Thus, a one-shot voltage pulse is generated on the node $N_{23}$ by the one-shot circuit 30.

As a result, the respective voltages latched on the nodes $N_{21}$ and $N_{22}$ are elevated by the one-shot voltage appearing on the node $N_{23}$, by the action of the capacitors $C_{21}$ and $C_{22}$ whose one electrode is connected to the node $N_{23}$. Thereafter, the voltages latched on the nodes $N_{21}$ and $N_{22}$ will decrease with a decrease of the one-shot voltage appearing on the node $N_{23}$.

Accordingly, a voltage difference occurs between the nodes $N_{25}$ and $N_{26}$ by the action of the transistor $J_{21}$ having its gate connected to the node $N_{21}$ and the transistor $J_{22}$ having its gate connected to the node $N_{22}$. This voltage difference between the nodes $N_{25}$ and $N_{26}$ will drive a flipflop formed by the transistors $J_{31}$ and $J_{32}$, with the result that one of the nodes $N_{25}$ and $N_{26}$ having a voltage lower than that of the other will become further low. Therefore, the transistors $J_{35}$ and $J_{36}$ having their gates connected to the nodes $N_{26}$ and $N_{25}$, respectively, will lower one of the nodes $N_{27}$ and $N_{28}$. Namely, the true and complementary output signals $\phi_o$ and $\bar{\phi}_o$ are determined.

In this circuit, the true output signal $\phi_o$ is given by an amplified signal in the same phase as that of the input voltage $V_{IN}$ and the complementary output signal $\bar{\phi}_o$ is given by an amplified signal in a phase inverse to that of the input voltage $V_{IN}$.

The above mentioned input buffer is characterized in that, at an initial stage of the comparison operation triggered by the activation signal $\phi_a$, the potentials of the nodes $N_{21}$ and $N_{22}$ are elevated by the action of the capacitors $C_{21}$ and $C_{22}$ and the one-shot circuit composed of the transistors $J_{25}$ and $J_{28}$, so that the operation regions of the transistors $J_{21}$ and $J_{22}$ having their gates connected to the nodes $N_{21}$ and $N_{22}$, respectively, are effectively or equivalently extended, whereby a stable operation will be attained.

In the above mentioned input buffer, however, when the external input voltage $V_{IN}$ is at a high level, the output node $N_{25}$ will become a high level. At this time, since the transistor $J_{22}$ receiving at its gate the reference voltage $V_{ref}$ is ceaselessly maintained in an activated or conducting condition, an electric charge on the one output node $N_{25}$ having the high level will be discharged to the ground through the transistor $J_{22}$. As a result, the flipflop circuit cannot retain the high level voltage on the node $N_{25}$. Therefore, if the above mentioned input buffer is used, a circuit receiving the output of the input buffer has been required to include a function of holding the information of the input signal. Accordingly, the circuit including the input buffer has inevitably needed an increased number of circuit elements.

Furthermore, the above mentioned input buffer has required the one-shot circuit 30, particularly the transistors $J_{25}$ and $J_{26}$ for generating and supplying a one-shot voltage pulse to the nodes $N_{21}$ and $N_{22}$, as well as the transfer gate transistors $J_{23}$ and $J_{24}$ for introducing the input voltage and the reference voltage to the nodes $N_{21}$ and $N_{22}$, respectively, and the application of the latch signal $\phi_L$ to the respective gates of the transfer transistors. In addition, a pair of capacitors $C_{21}$ and $C_{22}$ have been required. Therefore, the overall circuit or system including the above mentioned input buffer is of large scale.

Figure 3:
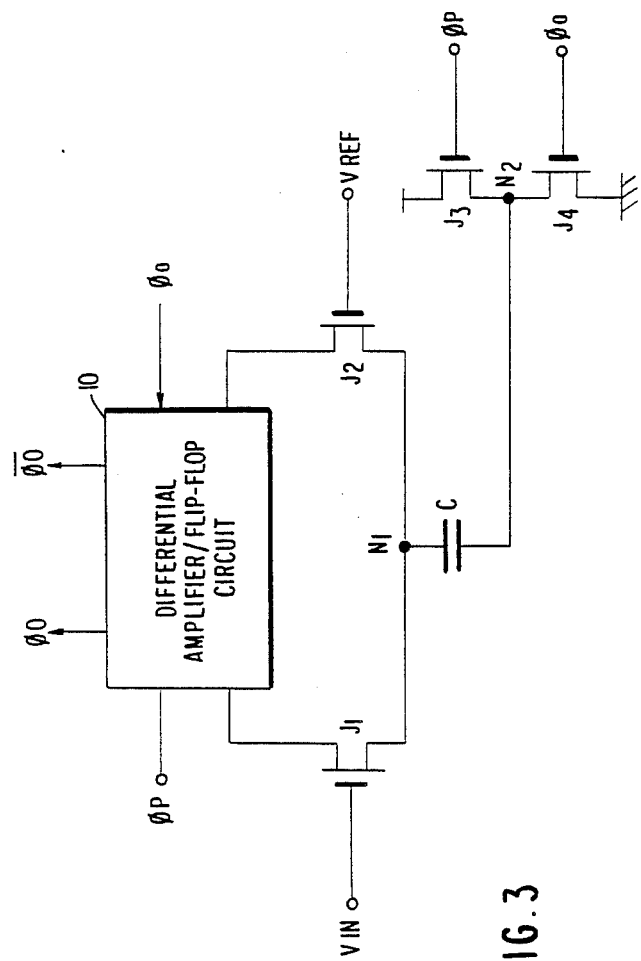
FIG. 3 is a circuit diagram of one embodiment of the input buffer in accordance with the present invention.

Referring to FIG. 3, there is shown in a circuit diagram of one embodiment of the input buffer in accordance with the present invention. The shown input buffer receives an external input voltage $V_{IN}$ and a reference voltage $V_{ref}$ as well as precharge signal $\phi_p$ and an activation signal $\phi_a$, similar to the conventional input buffer shown in FIG. 1, but does not require a latch signal $\phi_L$, as does the conventional input buffer. In addition, the shown input buffer generates true and complementary output signals $\phi_o$ and $\overline{\phi_o}$, similar to the conventional input buffer shown in FIG. 1. Furthermore, the circuit shown in FIG. 3 is composed of only N-channel enhancement MOS field effect transistors, similar to the conventional input buffer shown in FIG. 1.

The input buffer shown in FIG. 3 includes one pair of transistors $J_1$ and $J_2$ having their gates connected to receive the external input voltage $V_{IN}$ and the reference voltage $V_{ref}$, respectively. These transistors are connected at their drains to a pair of inputs of a differential amplifier/flipflop circuit 10, respectively, and have their sources commonly connected to a node $N_1$. The node $N_1$ is connected through a capacitor C to another node $N_2$, which is in turn connected to a source of a transistor $J_3$ and a drain of a transistor $J_4$. Transistors $J_3$ and $J_4$ form a bias control circuit for controlling the bias potential at node $N_2$. The transistor $J_3$ has its drain connected to a positive voltage supply and its gate connected to rfeceive the precharge signal $\phi_p$. On the other hand, the transistor $J_4$ has its source grounded and its gate connected to receive the activation signal $\phi_a$. Furthermore, the differential amplifier/flipflop circuit 10 receives the precharge signal $\phi_p$ and the activation signal $\phi_a$, and generates the true and complementary output signals $\phi_o$ and $\overline{\phi_o}$ on the basis of a voltage difference between the external input voltage $V_{IN}$ and the reference voltage $V_{ref}$.

In the input buffer shown in FIG. 3, a potential change on the node $N_2$ caused by the transistors $J_3$ and $J_4$ will be transferred to the node $N_1$ by an AC voltage transfer function of the capacitor C. As a result, for a period of a high level activation signal, the potential on the node $N_1$ will be made further lower than the (low) level at the time of a high level precharge signal. Accordingly, the operation range of the transistors $J_1$ and $J_2$ will be equivalently enlarged. Thus, the differential amplifier/flipflop circuit 10 will stably operate, and can hold therein the information of the input voltage signal $V_{IN}$.

Figure 4:
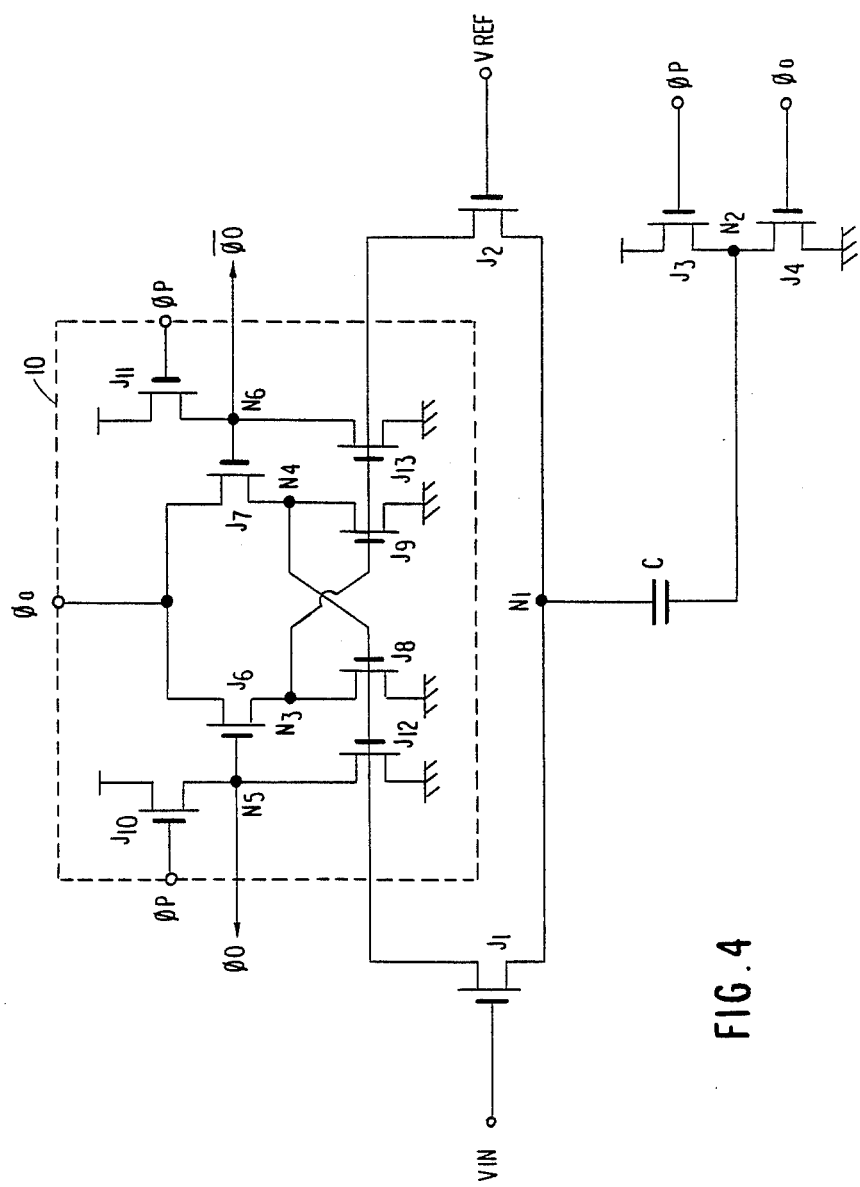
FIG. 4 is a more detailed circuit diagram of the input buffer shown in FIG. 3.

Turning to FIG. 4, there is shown a circuit diagram of the input buffer shown in FIG. 3 but illustrating one example of the differential amplifier/flipflop circuit 10. The shown differential amplifier/flipflop circuit 10 has substantially the same construction as that of the differential amplifier/flipflop circuit 20 shown in FIG. 2. Namely, the differential amplifier/flipflop circuit 10 includes a pair of transistors $J_6$ and $J_7$ having their drains commonly connected to receive the activation signal $\phi_a$, respectively. A source of the transistor $J_6$ is connected to a node $N_3$, which is turn connected to a drain of a source-grounded transistor $J_8$, and on the other hand, a gate of the transistor $J_8$ is connected to a node $N_4$, which is in turn connected to a drain of another source-grounded transistor $J_8$ is cross-connected to the node $N_4$, which is also connected to the drain of the transistor $J_1$, and on the other hand, a gate of the transistor $J_9$ is cross-connected to the node $N_3$, which is also connected to the drain of the transistor $J_2$. Furthermore, the differential amplifier-flipflop circuit 10 includes a transistor $J_{10}$ having its drain connected to the ppositive power supply and its gate connected to receive the precharge signal $\phi_p$. A source of the transistor $J_{10}$ is connected through a node $N_5$ to a gate of the transistor $J_6$ and a drain of a source-grounded transistor $J_{12}$, whose gate is connected to the gate of the transistor $J_8$. The connection node $N_5$ between the transistors $J_{10}$ and $J_{12}$ gives the true output signal $\phi_o$. On the other hand, there is provided a transistor $J_{11}$ having its drain connected to the positive power supply and its gate connected to receive the precharge signal $\phi_p$. A source of the transistor $J_{11}$ is connected through a node $N_6$ to a gate of the transistor $J_7$ and a drain of a another source-grounded transistor $J_{13}$, whose gate is connected to the gate of the transistor $J_9$. The connection node $N_6$ between the transistors $J_{11}$ and $J_{13}$ gives the complementary output signal $\overline{\phi_o}$.

Now, explanation will be made on operation of the input buffer shown in FIG. 4. First, the precharge signal $\phi_p$ is brought to a high level. Therefore, the transistors $J_3$, $J_{10}$ and $J_{11}$ receiving at their gates the precharge signal $\phi_p$ are turned on so that the nodes $N_2$, $N_5$ and $N_6$ are brought to a high level. At this time, the activation signal $\phi_a$ is maintained at a low level, the nodes $N_1$, $N_3$ and $N_4$ are maintained at a low level. Thereafter, the precharge signal $\phi_p$ is brought to a low level.

Then, when the activation signal $\phi_a$ is brought from the low level to a high level, the nodes $N_3$ and $N_4$ elevate their potentials through the transistors $J_6$ and $J_7$ since the nodes $N_5$ and $N_6$ have been maintained at the high level. At the same time, the node $N_2$ changes its potential from the high level to the low level as the result of the turning-on of the transistor $J_4$. Accordingly, the potential of the node $N_1$ is further lowered through the capacitor C (namely, by an AC mode potential transfer function of the capacitor) to a level which is lower than that when the precharge signal $\phi_p$ was brought to the high level. Therefore, the potentials of the nodes $N_3$ and $N_4$ will change in accordance with the gate voltages of the transistors $J_1$ and $J_2$, respectively. Thus, a voltage difference corresponding to the external input signal $V_{IN}$ will appear between the nodes $N_3$ and $N_4$, so that a flipflop formed by the transistors $J_8$ and $J_9$ will amplify the voltage difference, with the result that one of the nodes $N_3$ and $N_4$ is brought to a low level.

Therefore, the transistors $J_{12}$ and $J_{13}$ having their gates connected to the nodes $N_4$ and $N_3$, respectively, will lower one of the nodes $N_5$ and $N_6$. Namely, the true and complementary output signals $\phi_o$ and $\overline{\phi}_o$ are determined. The true output signal $\phi_o$ is in the same phase as that of the input voltage $V_{IN}$ and the complementary output signal $\overline{\phi}_o$ is in a phase inverse to that of the input voltage $V_{IN}$.

In the above mentioned operation of the input buffer, the electric charge on the nodes $N_3$ and $N_4$ is discharged by only an amount which charges the capacitor C through the transistors $J_1$ and $J_2$. In any case, a DC current will not flow through the nodes $N_3$ and $N_4$. Therefore, the differential amplifier/flipflop circuit 10 can hold therein the information of the input signal, and hence the output signal.

As seen from the above description, the above mentioned input buffer operates to lower the potentials of the sources of the transistors $J_1$ and $J_2$ to a level lower than that of the sources of the transistors $J_1$ and $J_2$ at an initial stage of the operation of the input buffer, by the action of the capcitor C and the transistors $J_3$ and $J_4$, so that the differential amplifier/flipflop circuit 10 is realized to stably operate and can hold therein the information of the input signal.

As will be apparent from the above description, the input buffer in accordance with the present invention is characterized in that a capacitor is connected at its one end commonly to respective sources of a first pair of transistors which are connected at their gates to receive an external input voltage and a reference voltage, respectively and in that a potential of the other end of the capacitor is controlled by a second pair of series-connected transistors which receive a precharge signal and an activation signal, respectively. The first pair of transistors is connected at its drains to a pair of inputs of a differential amplifier/flipflop circuit. Therefore, a current flowing through the first pair of transistors will be blocked by the capacitor, and therefore, the differential amplifier/flipflop circuit can retain therein information of a signal applied through the first pair of transistors. Accordingly, a circuit receiving the output of the input buffer is not required to have a circuit for retaining information of the signal outputted from the input buffer. In other words, the overall construction of a system or circuit including the input buffer will become more simple.

Furthermore, the input buffer in accordance with the present invention is characterized in that a latch circuit is not required for holding an external input signal, and therefore, the circuit is low in electric current consumption.

In addition, the first pair of transistors, connected at its gates to receive the external input voltage and the reference voltage, respectively, can have an operation region equivalently enlarged by the action of the potential of the other end of the capacitor controlled by the second pair of series-connected transistors. Therefore, the differential amplifier/flipflop circuit can realize a stable operation.

The above mentioned embodiment of the input buffer circuit is composed of only enhancement type N-channel MOS transistors. However, it would be apparent to persons skilled in the art that the input buffer circuit in accordance with the present invention can be composed of P-channel MOS transistors or bipolar transistors, and such a circuit will operate similar to that of the above mentioned embodiment.

The invention has thus been shown and described with reference to the specific embodiments. However, it should be noted that the present invention is in no way limited to the details of the illustrated structures but changes and modifications may be made within the scope of the appended claims.

What is claimed is:

1. An input buffer circuit which includes a flipflop circuit and which receives an input voltage signal and a reference voltage to amplify a difference between the input voltage signal and the reference voltage in response to an activation signal, comprising first and second transistors having their sources commonly connected to a first node and their drains coupled to a pair of inputs of the flipflop circuit, respectively, a gate of the first transistor being connected to receive the input voltage signal and a gate of the second transistor being connected to receive the reference voltage; a capacitor connected as its one end to the first node and at its other end to a second node; and a bias control circuit having an output connected to the second node and operating to respond to a precharge signal so as to bring the second node to a first level and to respond to the activation signal so as to bring the second node to a second level lower than the first level, so that the potential of the first node is consequentially lowered when the input buffer circuit executes the comparison operation in response to the activation signal and a current flowing through the first and second transistors is blocked by the capacitor.

2. An input buffer circuit claimed in claim 1 wherein the bias control circuit includes a third transistor having a drain connected to a high level voltage and a source connected to the second node, a gate of the third transistor being connected to receive the precharge signal, and a source-grounded fourth transistor having a drain connected to the second node, a gate of the fourth transistor being connected to receive the activation signal.

3. An input buffer circuit claimed in claim 2 wherein the flipflop circuit includes fifth and sixth transistors having their drains commonly connected to receive the activation signal and their sources connected to third and fourth nodes, respectively, gates of the fifth and sixth transistors being connected to fifth and sixth nodes, respectively, a source-grounded seventh transistor having a drain connected to the third node and a gate connected to the fourth node, a source-grounded eighth transistor having a drain connected to the fourth node and a gate connected to the third node, ninth and tenth transistors having their drains connected to a high level voltage and their gates connected to receive the precharge signal, respective sources of the ninth and tenth transistors being connected to the fifth and sixth nodes, respectively, and source-grounded eleventh and twelfth transistors having their drains connected to the fifth and sixth nodes, respectively and their gates connected to the gates of the seventh and eighth transistors, respectively.

4. An input buffer circuit which includes a differential circuit and which receives an input voltage signal and a reference voltage to amplify a difference between the input voltage signal and the reference voltage in response to an activation signal, comprising:

first and second transistors each having a main current path and a control electrode for controlling a current flowing through the main current path respective one ends of the main current paths of the first and second transistors being connected commonly to a first node, respective other ends of the main current paths of the first and second transistors being coupled to a pair of inputs of the differential circuit, respectively, the control electrode of the first transistor being connected to receive the input voltage signal and control electrode of the second transistor being connected to receive the reference voltage;

a capacitor connected at its one end of the first node and at its other end to a second node; and a bias control circuit having an output connected to the second node and operating to respond to a precharge signal so as to bring the second node to a first level and to respond to the activation signal so as to bring the second node to a second level lower than the first level, so that the potential of the first node is consequentially lowered when the input buffer circuit executes the comparison operation in response to the activation signal and a current flowing through the first and second transistors is blocked by the capacitor.

5. An input buffer circuit claimed in claim 4 wherein the bias control circuit includes third and fourth transistors each having a main current path and a control electrode for controlling a current flowing through the main current path one end of the main current path of the third transistor being connected to a high level voltage, the other end of the main current path of the third transistor being connected to the second node, the control electrode of the third transistor being connected to receive the precharge signal, and one end of the main current path of the fourth transistor being connected to the second node, the other end of the main current path of the fourth transistor being grounded, and the control electrode of the fourth transistor being connected to receive the activation signal.

* * * * *